(12) United States Patent
Koyama et al.

(10) Patent No.: US 7,122,470 B2
(45) Date of Patent: Oct. 17, 2006

(54) SEMICONDUCTOR DEVICE WITH A CMOS TRANSISTOR

(75) Inventors: Masato Koyama, Kanagawa-ken (JP); Akira Nishiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/340,549

(22) Filed: Jan. 27, 2006

(65) Prior Publication Data
US 2006/0138554 A1    Jun. 29, 2006

Related U.S. Application Data

(62) Division of application No. 10/321,634, filed on Dec. 18, 2002, now abandoned.

(30) Foreign Application Priority Data
Dec. 18, 2001    (JP) ............... 2001-384498

(51) Int. Cl.
*H01L 21/44* (2006.01)
(52) U.S. Cl. ............ 438/652; 438/659; 438/655; 257/342; 257/319; 257/340; 257/384; 257/385; 257/388
(58) Field of Classification Search ......... 257/342, 257/319, 340, 384, 385, 388, 412; 438/659, 438/652, 655, 231, 768
See application file for complete search history.

(56) References Cited

U.S. PATENT DOCUMENTS

| | | |
|---|---|---|
| 6,417,565 B1 | 7/2002 | Komatsu |
| 6,503,788 B1 | 1/2003 | Yamamoto |
| 6,688,584 B1 | 2/2004 | Iyer et al. |
| 2002/0048917 A1 | 4/2002 | Sekine et al. |

FOREIGN PATENT DOCUMENTS

| | | |
|---|---|---|
| EP | 0115287 | 8/1984 |
| JP | 59-136973 | 8/1984 |
| JP | 8-222734 | 8/1996 |
| JP | 10-209441 | 8/1998 |
| JP | 11-135789 | 5/1999 |
| JP | 2001-176985 | 6/2001 |

OTHER PUBLICATIONS

C. Hobbs, et al. "Sub-Quarter Micron CMOS Process for TiN-Gate MOSFETs with TiO$_2$ Gate Dielectric Formed by Titanium Oxidation" Symposium on VLSI Technology Digest of Technical Papers, 1999, pp. 133-134.

*Primary Examiner*—Nathan J. Flynn
*Assistant Examiner*—Tan Tran
(74) *Attorney, Agent, or Firm*—Oblon, Spivak, McClelland, Maier & Neustadt, P.C.

(57) ABSTRACT

A semiconductor device having a gate electrode free from increasing of resistance of the gate electrode, from decreasing of capacitance of the insulation film due to depletion, and from penetrating of impurity. The semiconductor device includes a silicon layer, a gate insulating film formed on the silicon layer, a metal boron compound layer formed on the gate insulating film, and a gate electrode formed on the metal boron compound layer and containing at least silicon.

16 Claims, 10 Drawing Sheets

SEMICONDUCTOR DEVICE WITH A CMOS TRANSISTOR

CROSS-REFERENCE TO RELATED APPLICATIONS

This application is based upon and claims the benefit of priority from the prior Japanese Patent Application No. 2001-384498, filed on Dec. 18, 2001, the entire contents of which are incorporated herein by reference.

BACKGROUND OF THE INVENTION

1. Field of the Invention

This invention relates to a semiconductor device and a fabricating method for the same.

2. Description of the Related Art

When a CMOS (Complementary Metal-Oxide-Semiconductor) device with a gate length of sub-micron (0.1 micrometer) generation is fabricated, there is a high possibility that silicon used for a generation before the above cannot be utilized for a gate electrode as it is.

The first reason thereof is that because silicon has a relatively high specific resistance of several tens $\Omega/\square$, RC delay cannot be disregarded in device operation if it is used as a gate electrode. For a device whose gate length is in the sub-micron generation, it is thought that the RC delay cannot be negligible unless the specific resistance of the gate electrode is 2 $\Omega/\square$ or less.

Furthermore, as the second reason of the above, there is a problem that the silicon gate electrode gets depleted. This is the phenomenon that solubility of the dopant impurity added in the silicon is limited to the extent of $1 \times 10^{20}$ per cubic centimeter at most and a depletion layer of a finite length comes to expand in the silicon gate side at the interface between the silicon gate electrode and a gate insulating film.

Because this depletion layer becomes practically a capacitance connected in series to the gate insulating film, the capacitance results in being accumulated to the gate insulating film. The accumulated capacitance is to be 0.3 nm (nanometer) in thickness calculated in terms of a silicon oxide film. The gate insulating film for a future device ought to be 1.5 nm in thickness calculated in terms of a silicon oxide film, so that the thickness of 0.3 nm of the accumulated capacitance calculated in terms of a silicon oxide film cannot be ignored.

On the other hand, decreasing the resistance of the silicon gate electrode is being tried by means of adding an impurity (such as phosphorus or boron) in high density thereto. However the thickness of the gate insulating film is required to be not greater than 1.5 nm calculated in terms of a silicon oxide film, so that a problem that the impurity of high density passes through the thin-filmed gate insulating film and reaches the silicon substrate becomes obvious. Therefore, a problem arises that the density of the impurity deviate from the designed value and then the threshold voltage gets varied.

In view of the above, it has been thought that a metal with a high melting point such as molybdenum, tungsten, tantalum or their nitrides is utilized for the gate electrode. This is so-called metal gate technology.

The metal gate has a low specific resistance compared to silicon in principle, so that the RC delay can be taken no account. In addition, because no depletion layer generates theoretically in the metal gate, any capacitance accumulated thereto does not take place. Furthermore, the metal gate is expected to be able to solve some problems concerning the silicon gate. For example, the problem that impurity penetrates to the gate insulating film never occurs, because the metal gate does not require addition of any impurities to decrease the resistance thereof.

However, the metal gate has some particular problems described below when the CMOS devices are prepared.

When the CMOS devices are formed, so-called dual $\phi$ (phi) metal gate technology, in which a metallic material having a work function of p+ silicon and a metallic material having a work function of n+ silicon are employed as a gate electrode of a p channel MOS transistor and a gate electrode of an n channel MOS transistor respectively, has been proposed.

The method mentioned above can be expected to control effectively the threshold voltage of the p channel MOS transistor and that of the n channel MOS transistor. However the dual $\phi$ metal gate is restricted by some conditions where a metallic material having a work function of p+ silicon and a metallic material having a work function of n+ silicon must be found and moreover those materials must be heat resistant, so that it will be quite difficult to find combination of the appropriate materials.

Moreover, even if two kinds of metallic materials having heat resistance and an appropriate work function can be found, there is a disadvantage that complicates fabricating process of LSI because the gate electrode of the p channel MOS transistor and that of the n channel MOS transistor need to be formed by separate steps from each other for the fabricating process.

As mentioned above, the RC delay cannot be disregarded because a conventional silicon gate electrode has a high specific resistance, and consequently results in a decrease of capacitance thereof caused by depletion of the silicon gate electrode. Besides, there are more problems that if an impurity is doped to lower the resistance, the impurity penetrates the gate insulating film out of the silicon gate electrode, so that the threshold voltage thereof gets fluctuated.

Furthermore, in a method where the n channel MOS and the p channel MOS employ two kinds of metallic gates (dual $\phi$ metal gate technology) as the gate electrodes, not only it is predicted that discovering combination of metallic materials used for the gate electrodes of the p channel MOS transistor and the n channel MOS transistor is difficult, but also there is a problem that the fabricating process thereof gets complicated.

SUMMARY OF THE INVENTION

The present invention is carried out in the light of the problems mentioned above and intended to lower the resistance of the gate electrode and to provide a semiconductor device having a gate electrode free from decreasing of the capacitance of the insulation film caused by depletion and from penetrating of the impurity.

The present invention is further intended to provide a method for fabricating the above-mentioned semiconductor device by a simple method using silicon process.

In accordance with an embodiment of the invention, a semiconductor device comprises a CMOS transistor formed on a substrate, having a p channel MOS transistor comprising an n type silicon layer, a gate insulating film formed on the n type silicon layer, a metal boron compound layer formed on the gate insulating film, and a gate electrode formed on the metal and containing boron compound layer at least silicon, and an n channel MOS transistor comprising a p type silicon layer, a gate insulating film formed on the p type silicon layer, a metal silicide layer formed on the gate insulating film, and a gate electrode containing at least silicon and formed on the metal silicide layer.

In this case, a metal fulfilling the following conditions is preferably used: that is to say, the metal contained in the metal boron compound layer and the metal contained in the metal silicide layer are the same element and the absolute value of the free energy of the metal boron compound layer is larger than the absolute value of the free energy of the metal silicide layer.

Furthermore, it is preferable that the gate electrode contains germanium.

More over it is desirable that the metal boron compound layer contains at least one metal selected from titanium, zirconium, and hafnium, and the gate insulating film is an oxide film of silicon or of at least one metal selected from any of zirconium, hafnium, titanium, tantalum, aluminum, yttrium, lanthanum, cerium, and other rare earth elements.

The atomic ratio of the metal boron compound layer is preferably to be metal: boron=1:1.5 to 2 for the present invention.

According to another embodiment of the present invention, a semiconductor device comprises a silicon layer, a gate insulating film formed on the silicon layer, a metal boron compound layer formed on the gate insulating film, and a gate electrode formed on the metal boron compound layer and containing at least silicon.

In accordance with another embodiment of the present invention, a fabricating method for a semiconductor device comprises the steps of forming a gate insulating film on a silicon substrate, forming a metallic thin film on the gate insulating film, forming a thin film containing at least silicon on the metallic thin film, adding boron to at least a part of the thin film, forming a metal silicide layer by reacting the whole of the metallic thin film to the part of the thin film containing silicon, and forming a metal boron compound layer by reacting a part of the metal silicide layer to boron.

According to this embodiment, the gate electrode of the p channel MOS transistor and that of the n channel MOS transistor, which have appropriate work functions respectively, can be formed by the same step; accordingly a CMOS integrated circuit that can control effectively the threshold voltages of the MOSs of both channels can be fabricated.

In accordance with another embodiment of the present invention, a fabricating method for a semiconductor device comprises the steps of forming a gate insulating film on a silicon substrate, forming a metallic thin film on the gate insulating film, forming a thin film containing at least silicon on the metallic thin film, adding boron to a first region of the thin film, adding an n type dopant to a second region of the thin film, forming a metal silicide layer by reacting the whole of the metallic thin film to a part of the thin film, and forming a metal boron compound layer by reacting a part of the metal silicide layer in the first region to boron.

In accordance with further embodiment of the present invention, a fabricating method for a semiconductor device comprises the steps of forming a gate insulating film added with a metal on a silicon substrate, forming a thin film containing at least silicon on the gate insulating film, adding boron to a first region of the thin film, adding an n type dopant to a second region of the thin film, forming a metal silicide layer by reacting the metal added to the surface of the gate insulating film to a part of the thin film, and forming a metal boron compound layer by reacting a part of the metal silicide layer in the first region to boron.

In accordance with further embodiment of the present invention, a fabricating method for a semiconductor device comprises the steps of forming a gate insulating film of metal oxide on a silicon substrate, reducing a surface of the gate insulating film, forming a thin film containing at least silicon on the gate insulating film, adding boron to a first region of the thin film, adding an n type dopant to a second region of the thin film, forming a metal silicide layer by reacting a reduced metal existing on the surface of the gate insulating film to a part of the thin film, and forming a metal boron compound layer by reacting a part of the metal silicide layer in the first region to boron.

In this case, the thin film preferably contains germanium.

Furthermore, Ti (titanium) is preferred for the metal of the metal boron compound layer or the metal silicide layer. However, Zr (zirconium), Hf (hafnium) etc., which are the congeners of Ti, may be employed because chemical properties thereof are similar.

DETAILED DESCRIPTION OF THE INVENTION

Hereinafter, the present invention will be explained in detail referring to the drawings. However the invention is not limited to embodiments described below, but can be carried out by varieties of devices.

(Embodiment 1)

Figure 1:
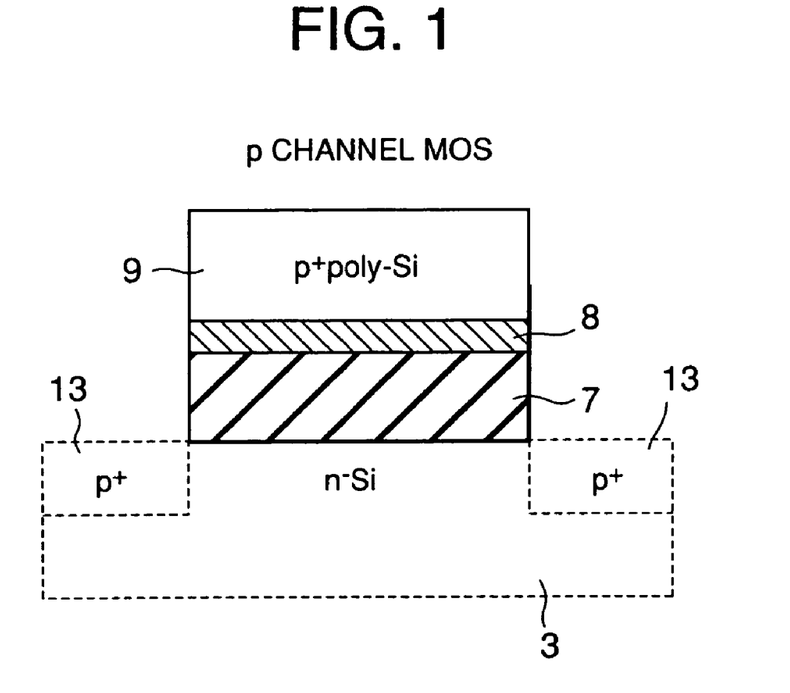
FIG. 1 is a cross sectional view of a p channel MOS transistor according to the present invention.

FIG. 1 is a cross sectional view of a semiconductor device according to the invention.

As shown in FIG. 1, the semiconductor device comprises anon type silicon layer 3, a gate insulating film 7 formed on the silicon layer, a metal boron compound layer 8 formed on the insulation film, and a gate electrode 9 of p+ polycrystalline silicon formed on the compound layer.

In the figure, both positions between which a gate insulating film 7 inside the n type silicon layer 3 is interposed are provided with a source region and a drain region 13 constituted of n+ silicon region. These portions mentioned above constitute the p channel MOS transistor.

The semiconductor device is characterized in that the metal boron compound layer 8 is formed on the gate insulating film 7. Because the metal boron compound layer 8 has conductivity i.e. sufficiently low specific resistance and acts like a metal, a gate parasitic resistance at the gate electrode 9 made of p+ polycrystalline silicon can be reduced and no depletion layer expands.

An example in which titanium is employed as a metallic material of the metal boron compound will be described. The specific resistance of the titanium boron compound is approximately 10 μΩcm, which is not inferior to metal gate materials. As a metallic material, zirconium, hafnium, etc. can be quoted as well as titanium. Resistances of the metal boron compounds of these metallic materials are sufficiently low and the depletion layers thereof do not expand.

Figure 2:
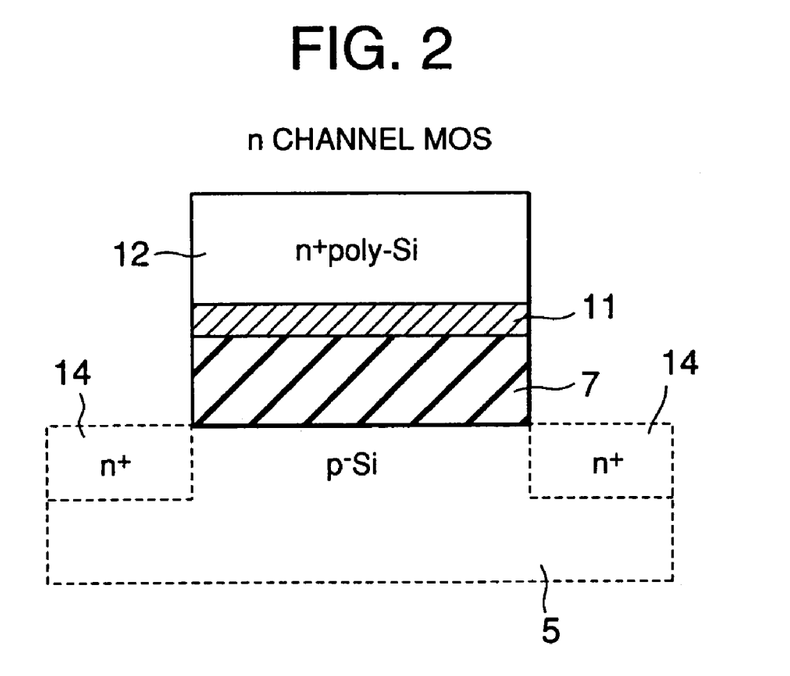
FIG. 2 is a cross sectional view of an n channel MOS transistor out of CMOS devices according to the present invention.

Additionally, the present invention is preferably carried out by a semiconductor device in which the p channel MOS transistor as shown in FIG. 1 and the n channel MOS transistor as shown in FIG. 2 are located on the same substrate.

The n channel MOS transistor shown in FIG. 2 comprises a p type silicon layer 5, a gate insulating film 7 formed on the silicon layer, a metal silicide layer 11 formed on the insulation film, and a gate electrode 12 of n+ polycrystalline silicon formed on the silicide layer.

In the figure, both positions between which a gate insulating film 7 inside the p type silicon layer 5 is interposed are provided with a source region and a drain region 14 constituted of p+ silicon region. These portions mentioned above constitute the n channel MOS transistor.

According to the present invention, a metal boron compound layer 8 is formed between the gate insulating film 7 and the p+ polycrystalline silicon gate electrode 9 for the p channel MOS transistor. The metal boron compound layer 8 does not create any serious problems on controlling the threshold voltage, because it has a work function significantly close to the work function of the p+ polycrystalline silicon. A metal silicide layer 11 is formed between the gate insulating film 2 and the n+ polycrystalline silicon gate electrode 7 for the n channel MOS transistor. The metal silicide layer 11 also does not create any serious problems on controlling the threshold voltage, because it has a work function significantly close to the work function of the n+ polycrystalline silicon.

By means of the invention, interposing the metal boron compound layer 8 between the gate insulating film 7 and the gate electrode 9 for the p channel MOS transistor, and interposing the metal silicide layer 11 between the gate insulating film 7 and the gate electrode 11 for the n channel MOS transistor, can make respective threshold voltages control favorably.

Figure 3:
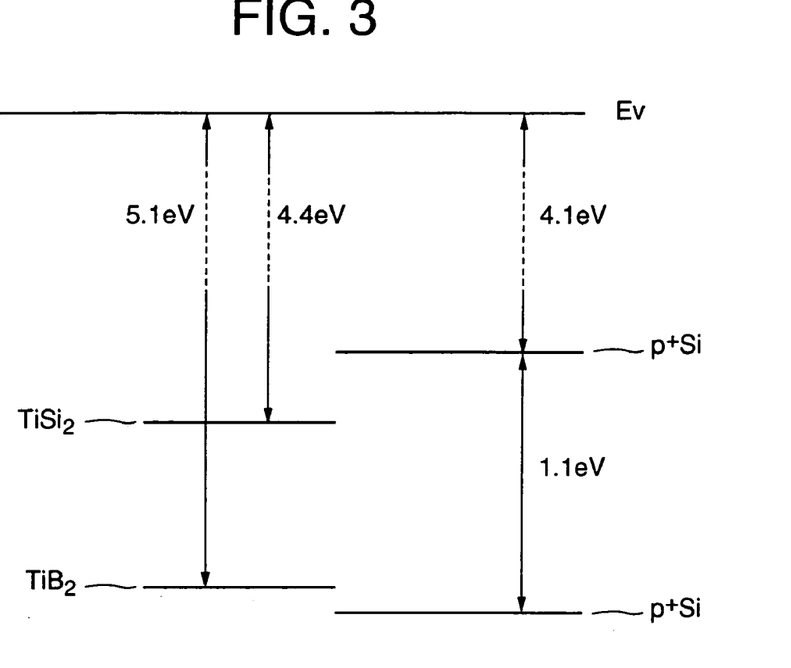
FIG. 3 shows energy band diagrams of titanium silicide, titanium boron compound, n+ silicon and p+ silicon.

FIG. 3 shows the relation concerning band diagrams among titanium boron compound (TiB$_2$), titanium silicide (TiSi$_2$) and silicon (n+Si, p+Si), when titanium is utilized as an example of the metallic material for the metal boron compound layer 8 and the metal silicide layer 11.

The work function of the titanium boron compound used for the p channel MOS transistor is 4.8 to 5.2 eV, and the work function of the titanium silicide used for the n channel MOS transistor is 4.4 eV. It is thus understood that these values are extremely close to the work function 5.2 eV of the p+ polycrystalline silicon and the work function 4.1 eV of the n+ polycrystalline silicon respectively. Consequently, respective threshold voltages of the p channel MOS transistor and the n channel MOS transistor can be favorably controlled.

Moreover, the specific resistance of the titanium silicide is equal to or smaller than 20 μΩcm, which is not inferior to that of the material of the metal gate.

Figure 4:
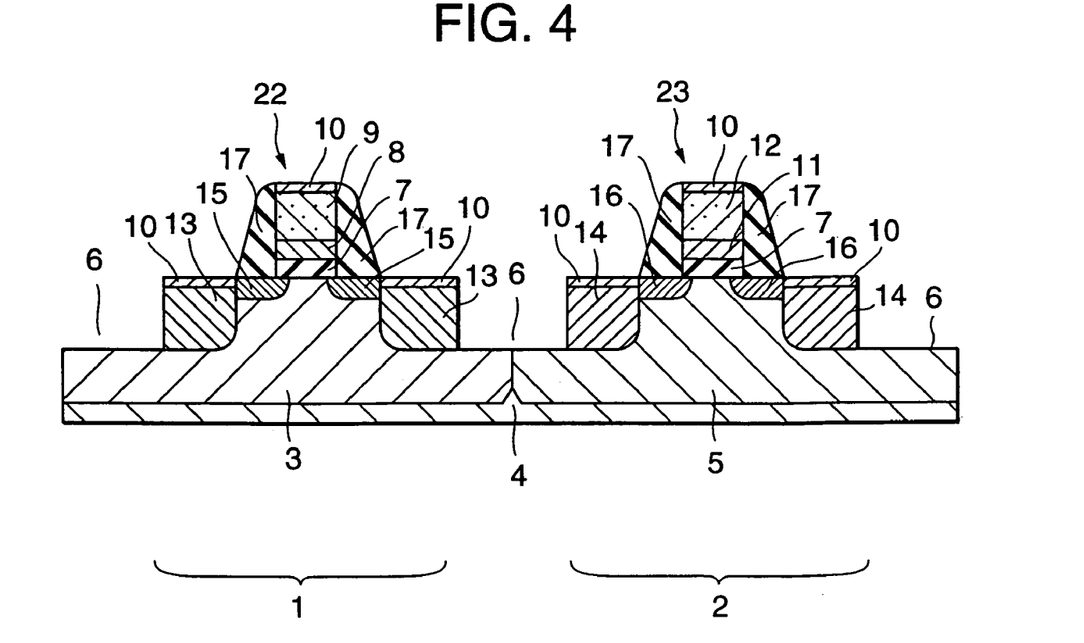
FIG. 4 is a cross sectional view of a CMOS device according to the present invention.

FIG. 4 shows a cross section of the CMOS device in which the p channel MOS transistor as shown in FIG. 1 and the n channel MOS transistor as shown in FIG. 2 are formed on the same silicon substrate 4.

As shown in FIG. 4, the p channel MOS transistor 1 and the n channel MOS transistor 2 are prepared on the silicon substrate 4 in a manner that a device isolation 6 of shallow trench structure is interposed between them in order to separate them from each other.

An N silicon well 3 is formed on the region of the silicon substrate 4 where the p channel MOS transistor 1 is formed. A P silicon well 5 is also formed on the region of the silicon substrate 4 where the n channel MOS transistor 2 is formed.

The p channel MOS transistor 1 comprises a laminated structure (MIS structure) comprising the gate insulating film 7 formed on the N silicon well 3, the metal boron compound layer 8 formed on the insulation film, the p+ polycrystalline silicon electrode 9 formed on the compound layer, and a SALICIDE (self aligned silicide) 10 formed on the silicon electrode. On the sidewalls of these laminated structures, gate sidewalls 17 of silicon nitride are formed.

At both positions between which the gate insulating film 7 in the N silicon well 3 is interposed, a deep p+ impurity diffusion layers 13 and a shallow p+ impurity diffusion layers 15 in which an impurity is doped in high concentration are formed, and both of them act as a source and a drain respectively. On the deep p+ impurity diffusion layer 13, a silicide layer with for example Co (cobalt) in such a manner of self-alignment i.e. the SALICIDE 10 is formed.

On the other hand, the P silicon well 5 is formed on a region of the silicon substrate 4, where the n channel MOS transistor 2 is formed.

Then channel MOS transistor 2 comprises a laminated structure (MIS structure) comprising the gate insulating film 7 formed on the P silicon well 5, the metal silicide layer 11 formed on the gate insulating film, the n+ polycrystalline silicon electrode 12 formed on the metal silicide layer, and a SALICIDE 10 formed on the n+ polycrystalline silicon electrode. On a sidewall of the laminated structure, a gate sidewall 17 of silicon nitride is formed.

At both positions between which the gate insulating film 7 in the P silicon well 5 is interposed, a deep n+ impurity diffusion layer 14 and a shallow n+ impurity diffusion layer 16 to which an impurity is doped in high concentration, and both of them act as a source and a drain. On the deep n+ impurity diffusion layer 14, the SALICIDE 10 as an electrode is formed.

Then, a fabricating method for the CMOS device shown in FIG. 5 will be described referring to FIG. 5 to FIG. 11.

Figure 5:
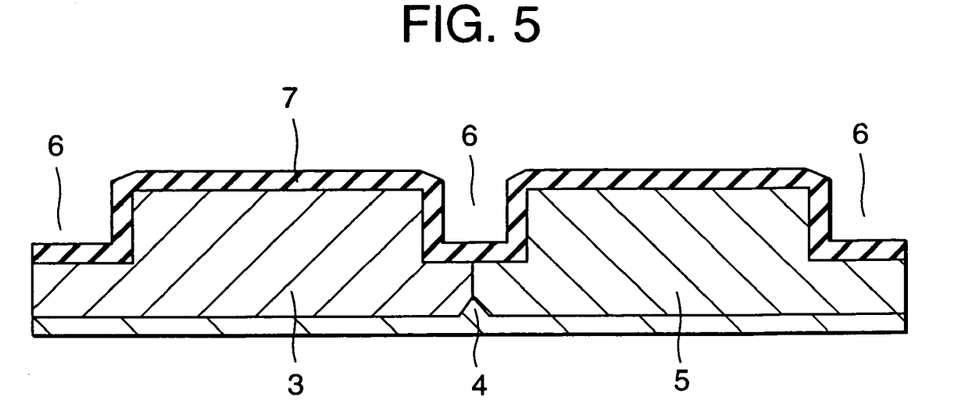
FIG. 5 is a cross sectional view showing an example of a fabricating step for a CMOS according to the present invention.

First of all, as shown in FIG. 5, the device isolation 6 of shallow trench structure is formed on the silicon substrate 4. Next, the N silicon well 3 and the P silicon well 5 are formed, and thereafter the gate insulating film 7 is formed.

Silicon oxide ($SiO_2$) film, silicon oxide nitride (SiON) film, other metal oxide films, metal silicate film, etc. can be used as the gate insulating film 7. Thickness thereof is 2 nm in the case of silicon oxide. Besides, in the case of metal oxide films, an oxide film of at least one metal selected from zirconium, hafnium, titanium, tantalum, aluminum, yttrium, lanthanum, cerium or other rare earth elements can be employed.

Figure 6:
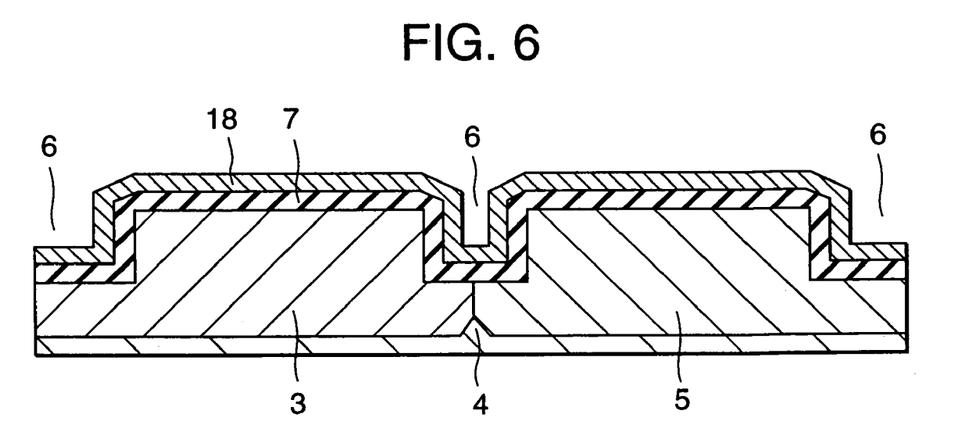
FIG. 6 is a cross sectional view showing an example of a fabricating step for a CMOS according to the present invention.

Then, as shown in FIG. 6, a metallic thin film 18 is deposited on the gate insulating film 7. In this case, titanium film was deposited by 1 nm in thickness as a metallic thin film by means of chemical vapor deposition (CVD) method.

As a metallic material, zirconium, hafnium, etc. as well as titanium can be utilized. Regarding to film forming method, CVD method which can form a film uniformly as it sticks fast to steps of the substrate is desirable, but evaporation method or sputtering method can also provide similar effect. Moreover the thickness of the metallic film 18 is preferably 0.5 nm to 2 nm. The reason why the thickness is not less than 0.5 nm is that there is a possibility of occurrence of pinholes etc. on the substrate, which make the metallic film be a discontinuous structure two-dimensionally, if the thickness is smaller than that. Meanwhile, the reason why the thickness is equal to or smaller than 2 nm is that a metallic film with a thickness greater than the above thickness results in a metal-rich composition when boron compound is formed in the following steps and metal-rich boron compounds are chemically unstable. The thickness of the metal boron compound layer in this case becomes 1 nm to 4 nm. The thickness of the metal silicide layer also becomes 1 nm to 4 nm.

Figure 7:
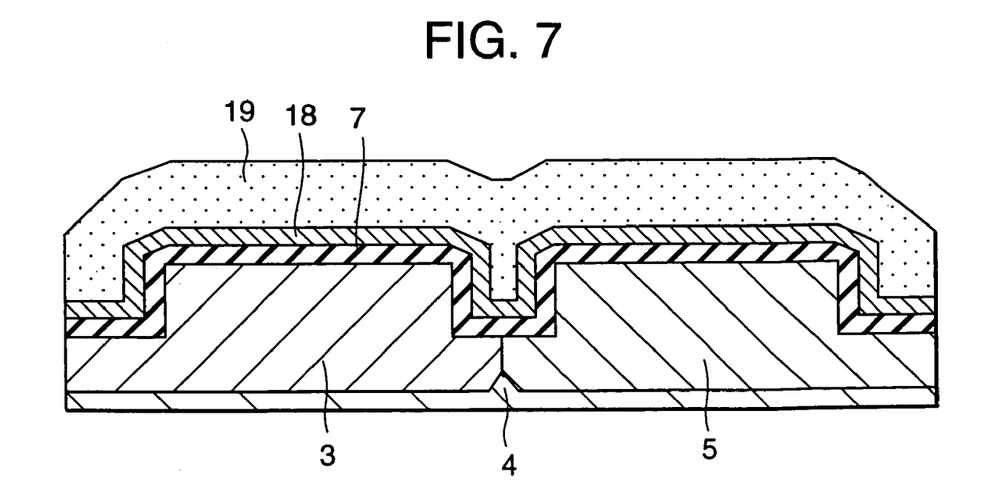
FIG. 7 is a cross sectional view showing an example of a fabricating step for a CMOS according to the present invention.

Next, as shown in FIG. 7, a non-doped polycrystalline silicon layer 19 is deposited on the metallic film 18 using a conventional method. Here as an example, the polycrystalline silicon layer 19 was deposited by 200 nm in thickness by the CVD method using $SiH_4$ gas.

Figure 8:
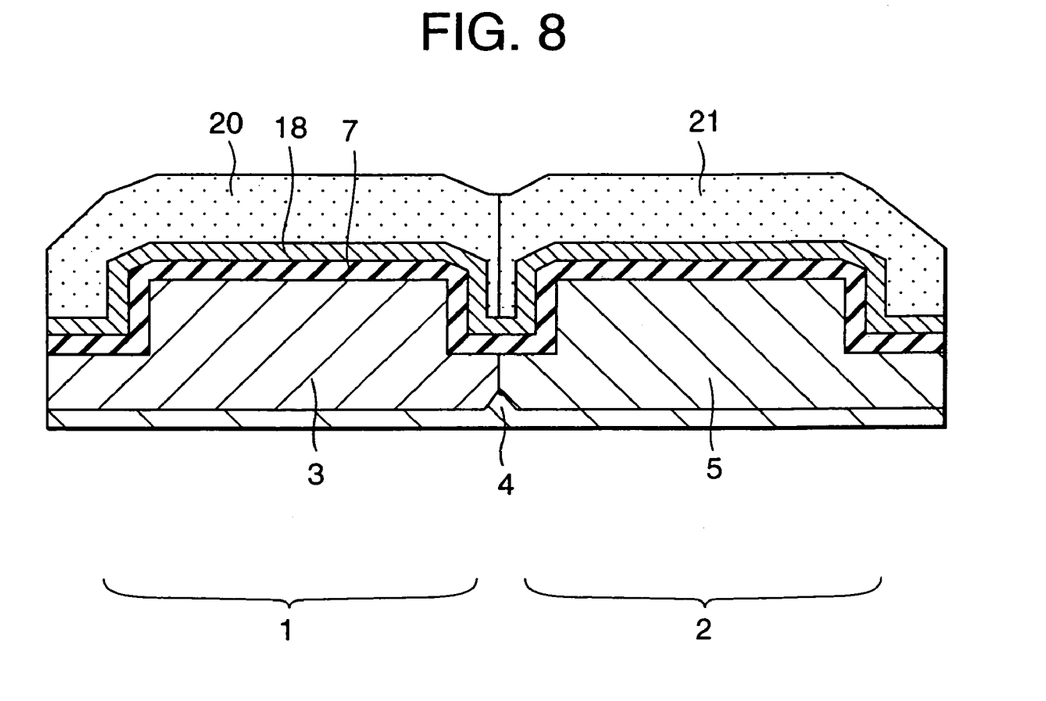
FIG. 8 is a cross sectional view showing an example of a fabricating step for a CMOS according to the present invention.

Next, as shown in FIG. 8, boron behaving as the acceptor impurity is added to the non-doped polycrystalline silicon layer 19 of the region 1, which becomes the p channel MOS transistor, so as to form a p type doped polycrystalline silicon layer 20.

On the other hand, phosphorus or arsenic behaving as the donor impurity is added to the non-doped polycrystalline silicon layer 19 of the region 2, which becomes the n channel MOS transistor, so as to form an n type doped polycrystalline silicon layer 21.

Ion implantation method, gaseous phase diffusion method, etc. can be used for the doping method by which the impurity is added. Doping of boron should be carried out only in the vicinity of the surface of the non-doped polycrystalline silicon layer 19 so as not to reach the metallic thin film 18. Otherwise, boron reacts to the metallic thin film 18 such as Ti in the impurity-doping step, so that uniformity thereof may be deteriorated.

Here, $BF_2$ was ion-implanted to the non-doped polycrystalline silicon layer 19 in the region 1, at which the p channel MOS transistor is formed, by means of the ion implantation method used for a regular process on the implantation condition of dose energy of 30 keV and dose amount of $5 \times 10^{15}/cm^2$.

In the meantime, As (arsenic) was ion-implanted to the non-doped polycrystalline silicon layer 19 in the region 2, at which the n channel MOS transistor is to be formed, on the implantation condition of ion energy of 50 keV and dose of $3 \times 10^{15}/cm^2$.

Figure 9:
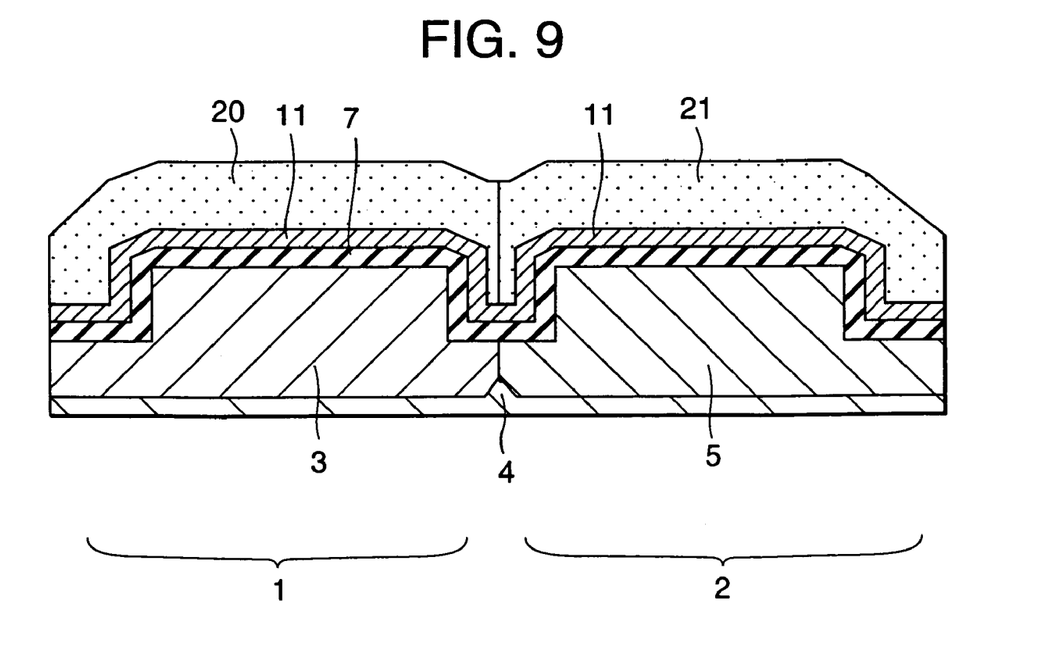
FIG. 9 is a cross sectional view showing an example of a fabricating step for a CMOS according to the present invention.

Then, as shown in FIG. 9, the entire metallic thin film 18, i.e. the region 1 thereof at which the p channel MOS transistor is to be formed and the region 2 thereof at which the n channel MOS transistor is to be formed, reacts to a part of the polycrystalline silicon 20 and 21, and thereby the uniform and flat metal silicide layer 11 is formed by putting the first heat treatment (700 to 800° C.) into practice.

As an example here, by the heat treatment in argon atmosphere of 750° C. during 30 seconds, reacting the titanium thin film 18 of 1 nm in thickness to the polycrystalline silicon 20 and 21 has formed the titanium silicide layer 11 ($TiSi_2$(C49)) of approximately 2 nm in thickness.

Figure 10:
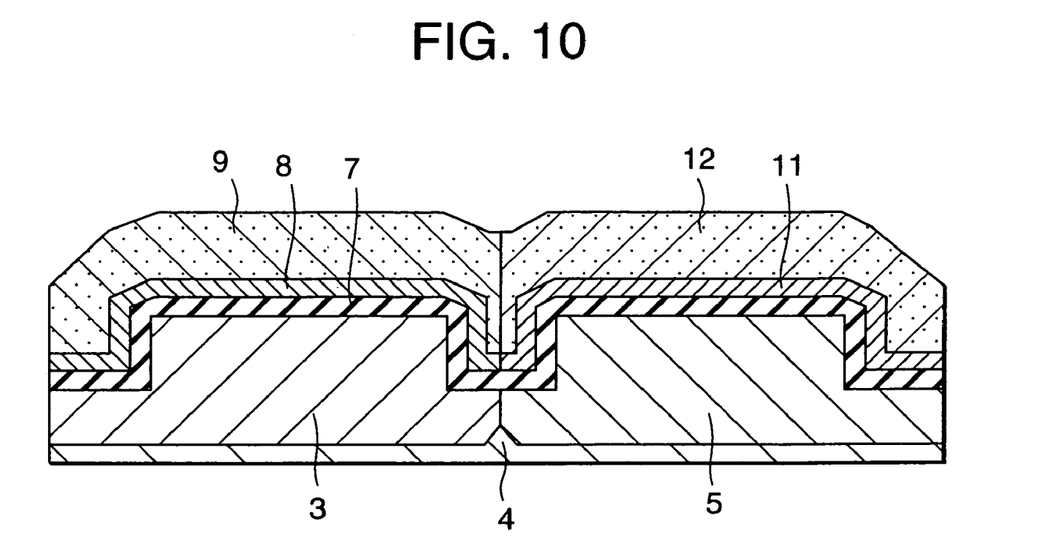
FIG. 10 is a cross sectional view showing an example of a fabricating step for a CMOS according to the present invention.

Subsequently, as shown in FIG. 10, solely the metal silicide layer 11 of the region 1 at which the p channel MOS transistor is to be formed reacts to the boron doped into the polycrystalline silicon layer 20, and thereby the uniform and flat metal boron compound 8 is formed by putting the second heat treatment (850 to 1000° C.) higher than the first heat treatment into practice.

As an example here, by means of the heat treatment in nitrogen atmosphere of 1000° C. during 20 seconds, reacting the titanium silicide ($TiSi_2$(C49)) layer 11 to the boron has formed the titanium boron compound ($TiB_2$) layer 8.

At this time, the titanium silicide ($TiSi_2$(C49)) layer 11 in the region 2 where the n channel MOS transistor is to be formed changes into the titanium silicide ($TiSi_2$(C54)) layer 11 and then the specific resistance thereof decreases. Flatness of the titanium silicide ($TiSi_2$(C54)) layer 11 is maintained.

Furthermore, by the second heat treatment step, the impurities added to the polycrystalline silicon layers 20 and 21 are simultaneously activated electrically, so that the p+ polycrystalline silicon layer 9 and the n+ polycrystalline silicon layer 12 are formed.

Figure 11:
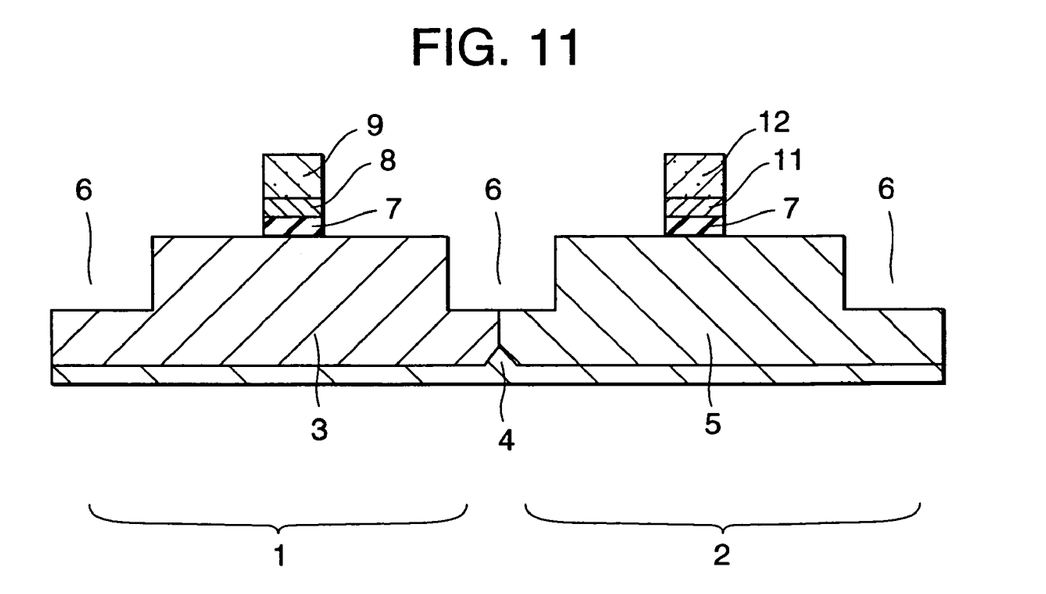
FIG. 11 is a cross sectional view showing an example of a fabricating step for a CMOS according to the present invention.

Then, as shown in FIG. 11, the laminated layer structure (MIS structure) comprising the gate insulating film 7, the metal boron compound layer 8, and the p+ polycrystalline silicon electrode 9 is formed by gate processing step in the region 1 of the p channel MOS transistor. On the other hand, the laminated layer structure (MIS structure) comprising the gate insulating film 7, the metal silicide layer 11, and the n+ polycrystalline silicon electrode 12 is formed at the same time by gate processing step in the region 2 of the n channel MOS transistor.

As an example here, the p+ polycrystalline silicon electrode 9, the n+ polycrystalline silicon electrode 12, the titanium boron compound layer 8 and the titanium silicide layer 11 were etched by reactive ion etching with a CF system reacting gas, and the gate insulating film 7 was etched with another existing gas system. The same gas system as silicon etching gas can process sufficiently the titanium boron compound and the titanium silicide. Replacing titanium with zirconium or hafnium achieves the same result.

Figure 12:
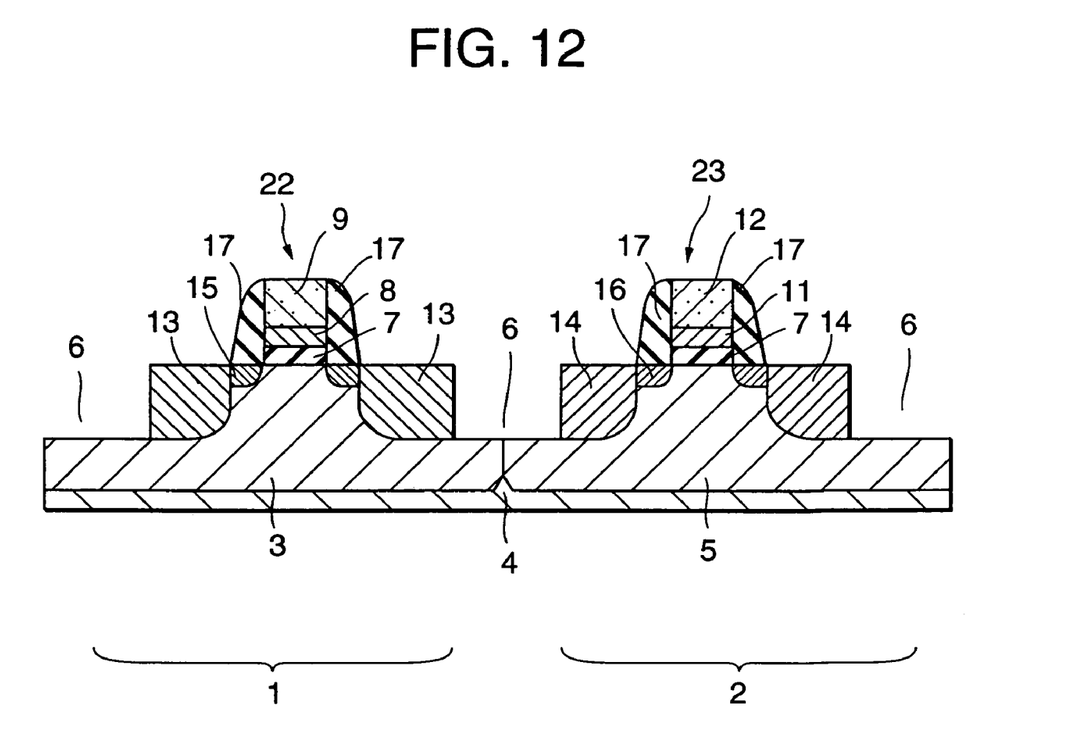
FIG. 12 is a cross sectional view showing an example of a fabricating step for a CMOS according to the present invention.

Subsequently, the shallow p+ impurity diffusion layer 15 and the shallow n+ impurity diffusion layer 16 are formed in self-alignment by means of ion implantation at the both sides of the gate, using laminated portions 22, 23 of the gate as a mask. Then as shown in FIG. 12, the sidewalls 17 of the gates of silicon nitride are formed with silicon oxide etc. on the sidewalls of the both gate laminated portions 22, 23. The deep p+ impurity diffusion layer 13 and the deep n+ impurity diffusion layer 14 are diffused in self-alignment by means of ion implantation, using the side walls 17 of the gate as a mask, in order to form the source-drain region.

Finally, as shown in FIG. 4, each SALICIDE 10 is formed on the deep impurity diffusion layers 13, 14 and the gate laminated portions 22, 23, and thereby the device is completed.

The most important point in the fabricating method for the CMOS device mentioned above is that the metal silicide layer 11 is formed on both of the p channel MOS transistor 1 and the n channel MOS transistor by the first heat treatment and then the metal boron compound layer 7 is formed on only the p channel MOS transistor 1 by reacting a part of the boron added to the polycrystalline silicon layer 20 to the metal silicide layer 11 by the second heat treatment.

The method mentioned above enables to form the metal boron compound and the metal silicide having an appropriate work function respectively for both of the p channel MOS transistor 1 and the n channel MOS transistor 2 as a part of the electrode by merely adding another heat treatment step to the conventional silicon process. Moreover, uniformity and flatness of the metal boron compound layer 8 and the metal silicide layer 11 can also be improved by the heat treatment.

Namely, the metallic thin film is kept reacted to the silicon gate electrode by the heat treatment on the condition that the metal silicide, which is chemically stable, is formed flat and uniformly in the first heat treatment step. On this condition, the uniform and flat metal silicide electrodes are formed on both of the p channel MOS transistor 1 and the n channel MOS transistor 2.

Then, in the second heat treatment, the metal silicide layer 11 formed in the region of the p channel MOS transistor 1 is converted into the boron compound layer 8. Thanks to the original metal silicide layer 11 formed uniformly and evenly, the metal boron compound layer 8 can also be formed evenly and uniformly. The second heat treatment step doubles as an electrical activation step for the impurity added to the silicon gates of the p channel MOS transistor and the n channel MOS transistor.

Next, an example of the metal silicide, which is converted into the metal boron compound after it reacts to boron, will be explained using titanium as the metal. This chemical reaction is theoretically predicted to be a reasonable reaction process allowed thermodynamically.

As an example, chemical reaction when the titanium silicide layer ($TiSi_2$) formed on a p+ silicon substrate doped with 1 atom % of boron is treated at a high temperature (850° C.) will be considered.

The chemical reaction formula when silicon (Si) and titanium boron compound ($TiB_2$) are formed out of boron-doped p+ silicon and titanium silicide ($TiSi_2$) is as follows:

Noteworthy point is that the generating free energy of this formula is $\Delta G = -10192 J(1000K)$. Namely, for this system, transformation from the titanium silicide ($TiSi_2$) to the titanium boron compound ($TiB_2$) is a chemical reaction proceeding voluntarily as long as boron exists.

To confirm practically the theoretical prediction described above, an experiment whether the titanium boron compound is formed or not is carried out as follows: Zirconium oxide is used as the gate insulating film, and a titanium thin film is formed thereon, and then a silicon layer doped with boron is deposited on the titanium film. A heat treatment at about 800° C. for the above structure is carried out and thereafter a high temperature heat treatment at about 1000° C. is put to practice.

Figure 13:
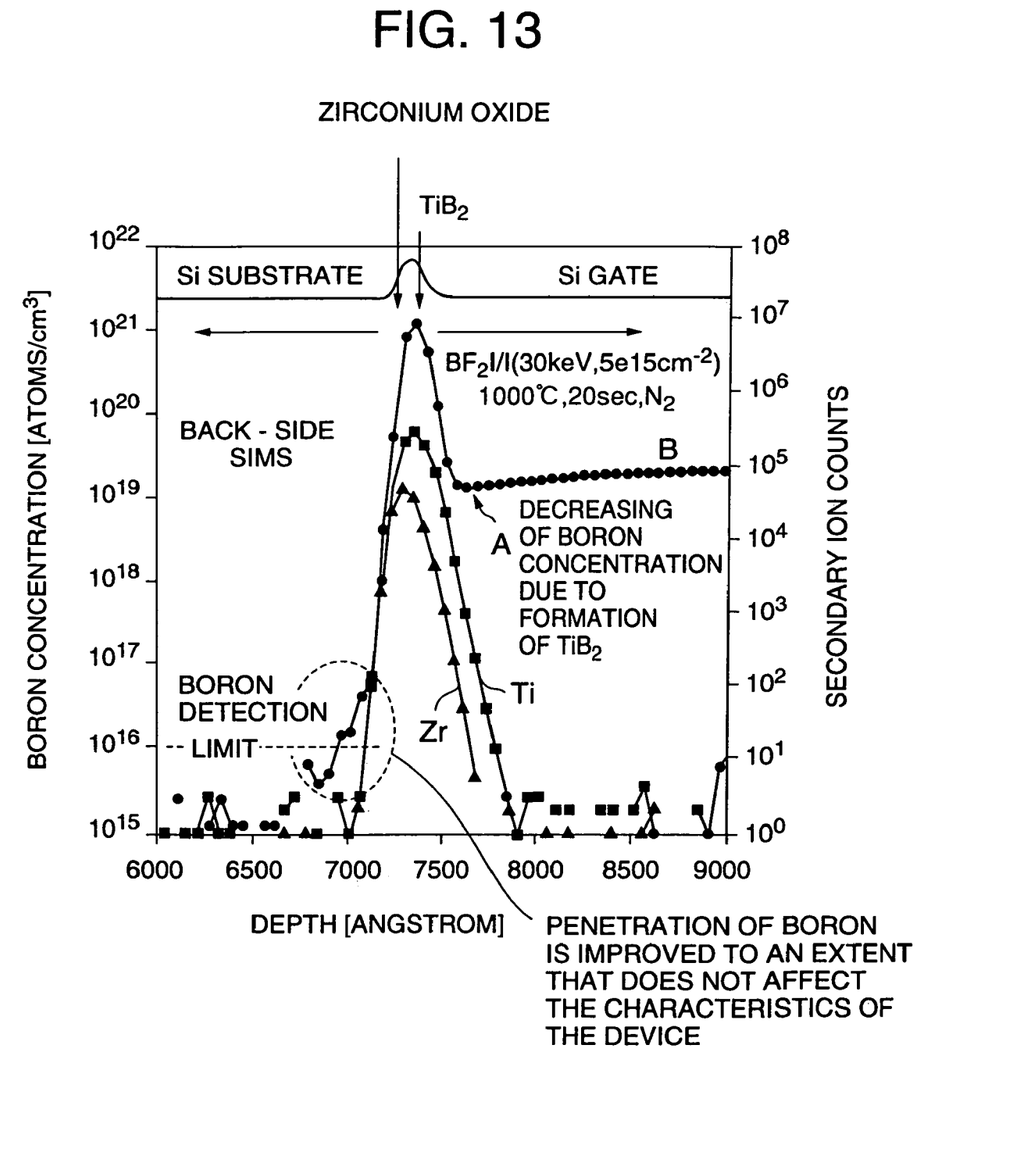
FIG. 13 is a graph of a result of a SIMS experiment showing possibility of formation of metal boron compound according to the present invention.

FIG. 13 shows the result of the experiment in which the formed laminated structure has been analyzed by SIMS. The abscissa axis represents the depth from the rear surface of the substrate and the ordinate axis represents the density of boron.

As shown in FIG. 13, in contrast to the peak of zirconium originated from the zirconium oxide film, the peaks of titanium and boron have the same shape and distribute shifted toward the silicon gate electrode. The above result has actually proven that a compound comprising titanium and boron is formed on the zirconium oxide film.

This is also clear by the fact that the density of boron in the silicon gate electrode is once decreasing near the boundary surface thereof to the zirconium oxide film (denoted by the arrow A in FIG. 13).

Figure 14:
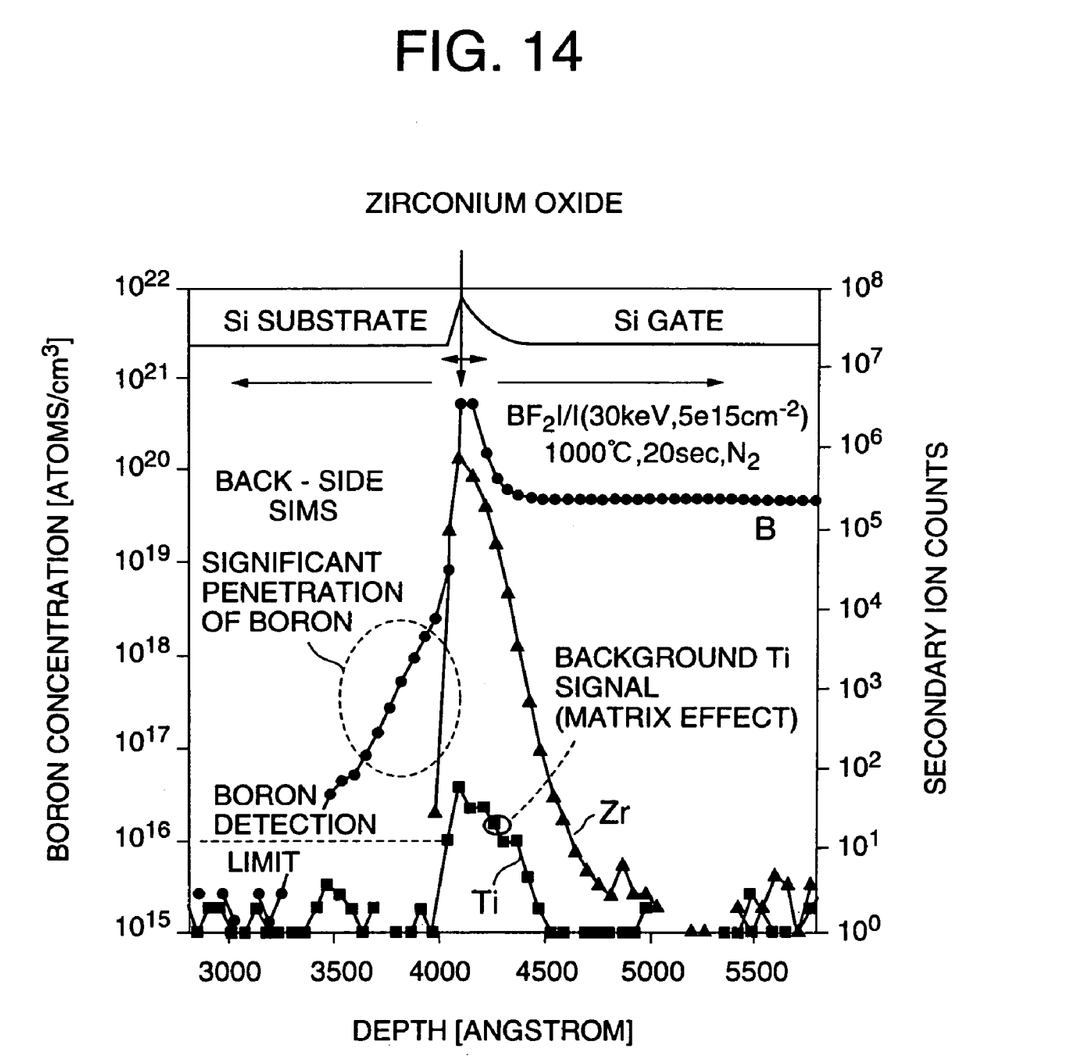
FIG. 14 is a graph of a result of a SIMS experiment showing no formation of metal boron compound.

For the sake of comparison, FIG. 14 shows the result of the experiment where the laminated structure on which the above-mentioned heat treatment has carried out in the absence of interposition of the titanium thin film has been analyzed by SIMS.

In this case, because no boron compound is naturally formed on the zirconium oxide, the boron density in the silicon gate electrode becomes flat.

It should be remarkable that there is a difference between FIG. 13 and FIG. 14 with regard to penetrating action of boron into the silicon substrate side.

That is to say, when the titanium boron compound ($TiB_2$) in FIG. 13 has been formed, the titanium boron compound ($TiB_2$) acts as an absorber for boron, so that it suppresses effectively diffusing of boron toward the silicon substrate.

Meanwhile, it is recognized that boron is diffusing in large quantities toward the silicon substrate in the case of FIG. 14.

As mentioned above, it is understood that the present invention can also prevent boron from penetrating.

The metal boron compound layer is preferably formed in the range of metal: boron=1: 1.5 to 2. The reason thereof is that if the rate of boron to metal is 1.5 or less, the effect of the invention cannot be achieved because chemical stability of the metal boron compound deteriorates.

Furthermore, the effect of the present invention can be well expected by employing some metal element wherein the absolute value of the free energy of its metal boron compound is larger than the absolute value of the free energy of its metal silicide.

Moreover a SiGe electrode containing germanium in the silicon electrode can be employed. Activation of impurity in Si can be executed at a low temperature, thanks to addition of Ge.

(Embodiment 2)

Then, another forming method for the metal silicide layer will be described. In this embodiment, a metal element is added to the gate insulating film during formation of the gate insulating film. Thereafter the silicon film is deposited thereon and then the metal added to the gate insulating film reacts to the silicon film so as to form the metal silicide layer.

Figure 15:
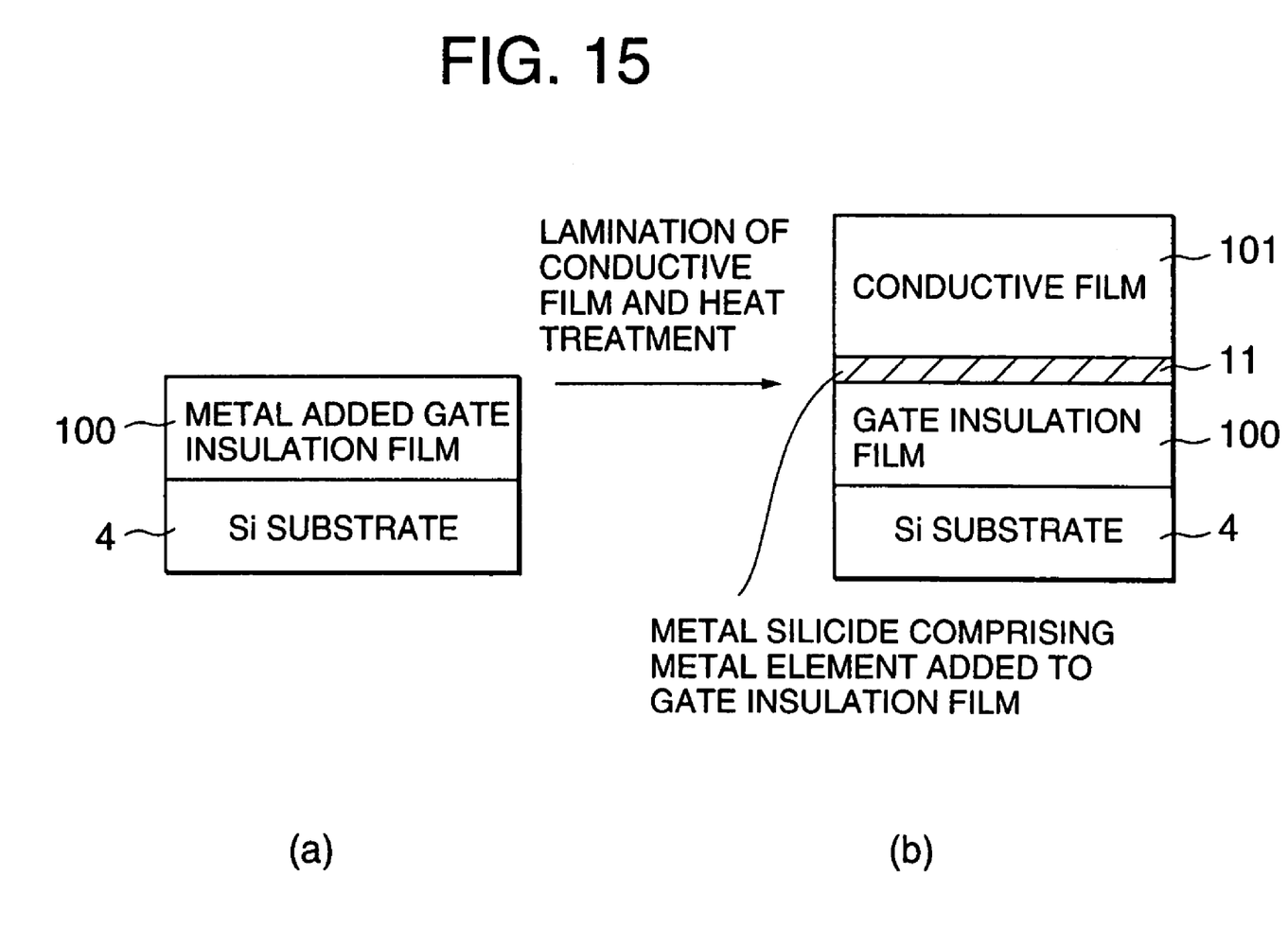
FIG. 15 is a schematic diagram of principal steps (a) and (b) in another method to form a metal silicide layer.

FIG. 15 shows the schematic diagram thereof.

As shown by the step (a) of FIG. 15, the metal-added gate insulating film 100 is formed on the silicon substrate 4. Here, an example where titanium metal is added to the zirconium oxide film by means of sputtering will be described.

First of all, a zirconium oxide target and a titanium metal target were used as the sputtering target, and argon gas only or argon gas added with minute quantity of oxygen was used as the sputtering gas.

When the oxygen gas is added to the argon gas, flow of the oxygen gas is preferably equal to or smaller than 1 sccm. By means of such filming measure, the zirconium oxide film to be formed has stoichiometric composition, and titanium element to be added is in a state which is short of coupling with oxygen element.

In the next place, as shown in the step (b) of FIG. 15, a silicon film, for example, as the conductive film 101 is deposited on the metal-added gate insulating film 100, and heat treatment of about 750° C. is put in execution. Thereby the metal silicide layer 11 is formed in the metal-added gate insulating film 100, and between the metal added gate insulating film 100 and the conductive film 101.

The reason for the above is that metal elements whose bonding to oxygen in the metal-added gate insulating film 100 is insufficient are reduced, and combine to silicon in the conductive film 101, and then form the titanium silicide layer 11.

There is a possibility that the impurity metal added in the insulation film diffuses into the side of the Si substrate 4, which contacts the gate insulating film 100, due to the heat treatment. However, in the practical fabrication, the surface of the substrate is exposed to the air and oxidized. The oxidized surface acts as a barrier that prevents the metal from diffusing toward the substrate side.

Such fabricating method has the following two advantages.

Firstly, in a step forming a metallic thin film on the gate insulating film as shown in the embodiment 1, it is very difficult to form a flat metallic thin film if the affinity between the gate insulating film and the metallic thin film is poor. On the contrary the method according to this embodiment can easily solve this problem.

Secondly, the method of this embodiment can diminish the forming steps for the metallic thin film and consequently has an advantage to be able to make the forming process short.

Preferably, titanium, zirconium and hafnium are employed as the metal element to be added to the gate insulating film in order to make them separately both silicide and boron compound in the method of this embodiment. Especially it is most desirable to add titanium that has a low-level oxidized state and can be reduced easily. As the gate insulating film to which the metal is added, the material system described in the embodiment 1 can be utilized as it is.

Although sputtering is presented here as an example of the forming method for the metal-added gate insulating film, the method is not limited to it.

(Embodiment 3)

Another forming method for the metal silicide layer will be then described. In this embodiment, a reduced metal oxide film (e.g. metallic thin film) is obtained by forming a gate insulating film and then reducing the surface thereof. Next, a silicon film is deposited thereon and a metal silicide layer is formed by reacting the reduced metal oxide film to the silicon film by heat treatment.

Figure 16:
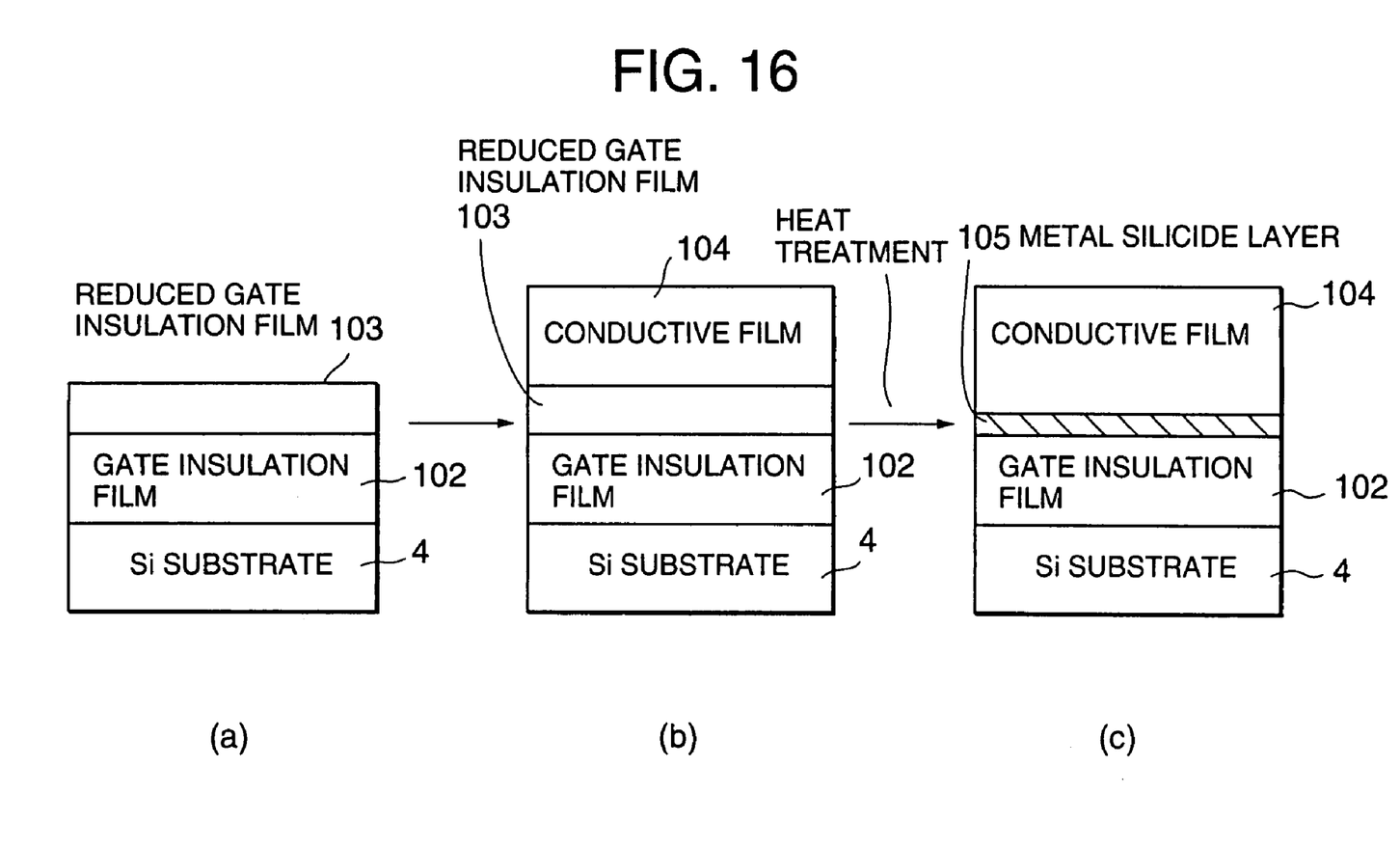
FIG. 16 is a schematic diagram of principal steps (a), (b) and (c) in another method to form a metal silicide layer.

FIG. 16 shows the schematic diagram thereof.

In the first place, as shown by the step (a) of FIG. 16, a gate insulating film 102 of metal oxide is formed on the silicon substrate 4. Titanium, zirconium, or hafnium can be employed as the metal. Then, a reduced metal oxide film, i.e. a metallic thin film 103 here, is formed by reducing a part of the surface of the gate insulating film 102 of metal oxide.

Heat treatment in a reductive atmosphere such as hydrogen can be put to practice for example as the reducing method. Although it is difficult technologically to reduce only a part of the gate insulating film 102 of metal oxide in such as ordinary hydrogen molecule atmosphere, it is technologically possible to reduce partially only the vicinity of the utmost surface of the gate insulating film 102 of metal oxide by means of being exposed by e.g. hydrogen radical or inert gas plasma.

In this case, the metal oxide shall not necessarily be reduced completely to the pure metal by reducing action, but a low-level metal oxide state, which is an unstable oxidized state, may be permitted.

Furthermore, for this partially reducing method, a metal silicate instead of the metal oxide can also be used.

Then, a silicon film for example, is formed on the metallic thin film 103 as the conductive thin film 104, as shown by the step (b) of FIG. 15.

Then, by means of heat-treating the substrate as shown by the step (c) of FIG. 15, the metal silicide layer 105 can be formed by reacting the silicon in the conductive thin film 104 to the metal in the metallic thin film 103.

The advantage of such fabricating method is that flat metal silicide and metal boron compound can be formed even if a system is difficult to form a flat metallic thin film on the gate insulating film.

The present invention can provide a semiconductor device having a gate electrode free from increasing of resistance of the gate electrode, from decreasing of capacitance of the insulation film due to depletion, and from penetrating of impurity.

Moreover, the fabricating method for the semiconductor device mentioned above can be provided by a simple method using silicon process.

What is claimed is:

1. A method for fabricating a semiconductor device, comprising:
    forming a gate insulating film on a silicon substrate,
    forming a metallic thin film on the gate insulating film, the metallic thin film comprising at least one metal selected from a group of titanium, zirconium and hafnium,
    forming a thin film containing silicon or silicon germanium on the metallic thin film,
    adding boron to at least a part of the thin film, forming a metal silicide layer as a gate electrode of an n channel MOS transistor by reacting the metallic thin film to the part of the thin film, and forming a metal boride layer as a gate electrode of a p channel MOS transistor by reacting a part of the metal silicide layer to boron, so that an absolute value of free energy of the metal boride layer is greater than an absolute value of free energy of the metal silicide.

2. The method for fabricating a semiconductor device as stated in claim 1, wherein the metal boride layer contains at least one metal selected from transition metals of group 4, and the gate insulating film is an oxide film of silicon or of at least one metal selected from any of transition metals of group 4, tantalum, aluminum, yttrium, lanthanum, cerium and another rare earth element.

3. The method for fabricating a semiconductor device as stated in claim 1, wherein an atomic composition ratio of the metal ride layer is metal:boron=1:1.5 to 2.

4. The method for fabricating a semiconductor device as stated in claim 1, wherein the at least one metal is titanium.

5. A method for fabricating a semiconductor device comprising:

forming a gate insulating film on a silicon substrate, forming a metallic thin film on the gate insulating film, the metallic thin film comprising at least one metal selected from a group of titanium, zirconium and hafnium, forming a thin film containing silicon or silicon germanium on the metallic thin film, adding boron to a first region of the thin film, adding n type dopant to a second region of the thin film, forming a metal silicide layer as a gate electrode of an n channel MOS transistor in the first and second region by reacting the metallic thin to a part of the thin film, and forming a metal boride layer as a gate electrode of a p channel MOS transistor by reacting a part of the metal silicide layer in the first region to boron, so that an absolute value of free energy of the metal boride is greater than an absolute value of free energy of the metal silicide.

6. The method for fabricating a semiconductor device as stated in claim 5, wherein the metal boride layer contains at least one metal selected from transition metals of group 4, and the gate insulating film is an oxide film of silicon or of at least one metal selected from any of transition metals of group 4, tantalum, aluminum, yttrium, lanthanum, cerium and another rare earth element.

7. The method for fabricating a semiconductor device as stated in claim 5, wherein an atomic composition ratio of the metal boride layer is metal:boron=1:1.5 to 2.

8. The method for fabricating a semiconductor device as stated in claim 5, wherein the at least one metal is titanium.

9. A method for fabricating a semiconductor device, comprising:

forming a gate insulating film on a silicon substrate, the gate insulating film including at least one metal selected from a group of titanium, zirconium and hafnium, forming a thin film containing silicon or silicon germanium on the gate insulating film, adding boron to a first region of the thin film, adding an n type dopant to a second region of the thin film, forming a metal silicide layer as a gate electrode of an n channel MOS transistor in the first and second region by reacting the at least one metal to a part of the thin film, and forming a metal boride layer as a gate electrode of a p channel MOS transistor by reacting a part of the metal silicide layer in the first region to boron, so that an absolute value of free energy of the metal boride is greater than an absolute value of free energy of the metal silicide.

10. The method for fabricating a semiconductor device as stated in claim 9, wherein the metal boride layer contains at least one metal selected from transition metals of group 4, and the gate insulating film is an oxide film of silicon or of at least one metal selected from any of transition metals of group 4, tantalum, aluminum, yttrium, lanthanum, cerium and another rare earth element.

11. The method for fabricating a semiconductor device as stated in claim 9, wherein atomic composition ratio of the metal boride layer is metal:boron=1:1.5 to 2.

12. The fabricating method for a semiconductor device as stated in claim 9, wherein the at least one metal is titanium.

13. A method for fabricating a semiconductor device comprising:

forming a gate insulating film on a silicon substrate, the gate insulating film including an oxide of at least one metal selected from a group of titanium, zirconium and hafnium, reducing a surface of the gate insulating film, forming a thin film containing silicon or silicon germanium on the gate insulating film, adding boron to a first region of the thin film, adding an n type dopant to a second region of the thin film, forming a metal silicide layer as a gate electrode of an n channel MOS transistor in the first and second regions by reacting a reduced metal on a surface of the gate insulating film to a part of the thin film, and forming a metal boride layer as a gate electrode of a p channel MOS transistor by reacting a part of the metal silicide layer in the first region to boron, so that an absolute value of free energy of the metal boride is greater than an absolute value of free energy of the metal silicide.

14. The method for fabricating a semiconductor device as stated in claim 13, wherein the metal boride layer contains at least one metal selected from transition metals of group 4, and the gate insulating film is an oxide film of silicon or of at least one metal selected from any of transition metals of group 4, tantalum, aluminum, yttrium, lanthanum, cerium and another rare earth element.

15. The method for fabricating a semiconductor device as stated in claim 13, wherein atomic composition ratio of the metal boride layer is metal:boron=1:1.5 to 2.

16. The fabricating method for a semiconductor device as stated in claim 13, wherein the at least one metal is titanium.

* * * * *